United States Patent [19]
Satorius

[11] Patent Number: 6,026,053
[45] Date of Patent: Feb. 15, 2000

[54] PHOTOREFRACTIVE READ-ONLY OPTICAL MEMORY APPARATUS USING PHASE, FREQUENCY, AND ANGULAR MODULATION

[75] Inventor: Duane Anthony Satorius, Silver Spring, Md.

[73] Assignee: The United States of America as represented by the Director of the National Security Agency, Washington, D.C.

[21] Appl. No.: 09/316,031

[22] Filed: May 21, 1999

[51] Int. Cl.$^7$ ...................................................... G11C 13/00
[52] U.S. Cl. .......................... 365/235; 365/234; 365/127
[58] Field of Search .................................... 365/235, 234, 365/120, 127

[56] References Cited

U.S. PATENT DOCUMENTS

| | | |
|---|---|---|
| 4,682,681 | 7/1987 | Hosoya . |
| 5,007,690 | 4/1991 | Chen et al. . |
| 5,379,266 | 1/1995 | Russell . |
| 5,696,714 | 12/1997 | Russell . |

Primary Examiner—Vu A. Le
Attorney, Agent, or Firm—Stephen M. Bloor

[57] ABSTRACT

The present invention stores and retrieves digital information by altering the phase transmission characteristics of a multiple layer phase recording by modulating the carrier frequency and the carrier frequency angle. These layers are organized into several regions, called page areas, which contain an array of juxtaposed encoded digital information data. Each page area may have several pages of digital information; each recorded with a different carrier frequency and carrier angle. The data layers are stacked together and aligned such that the page areas and encoded digital information on them are also aligned with each other into books. When one of these books is selectively illuminated by a controllable light source, a lenslet aligned with that book projects the transformed images of the data pages within that book, through a shutter array, and a reimaging lens onto a photosensor detector array. By selectively illuminating individual books and selectively opening the transform plane shutter to pass a single desired transformed page of digital data, any desired page of any desired book in the stack of data layers can be imaged onto the photosensor detector array. Pages of data can thus be randomly accessed and all data on that page can be read in parallel at speeds limited only by the access speeds of the illumination source, spatial frequency plane shutter array, and photosensor detector array.

6 Claims, 9 Drawing Sheets

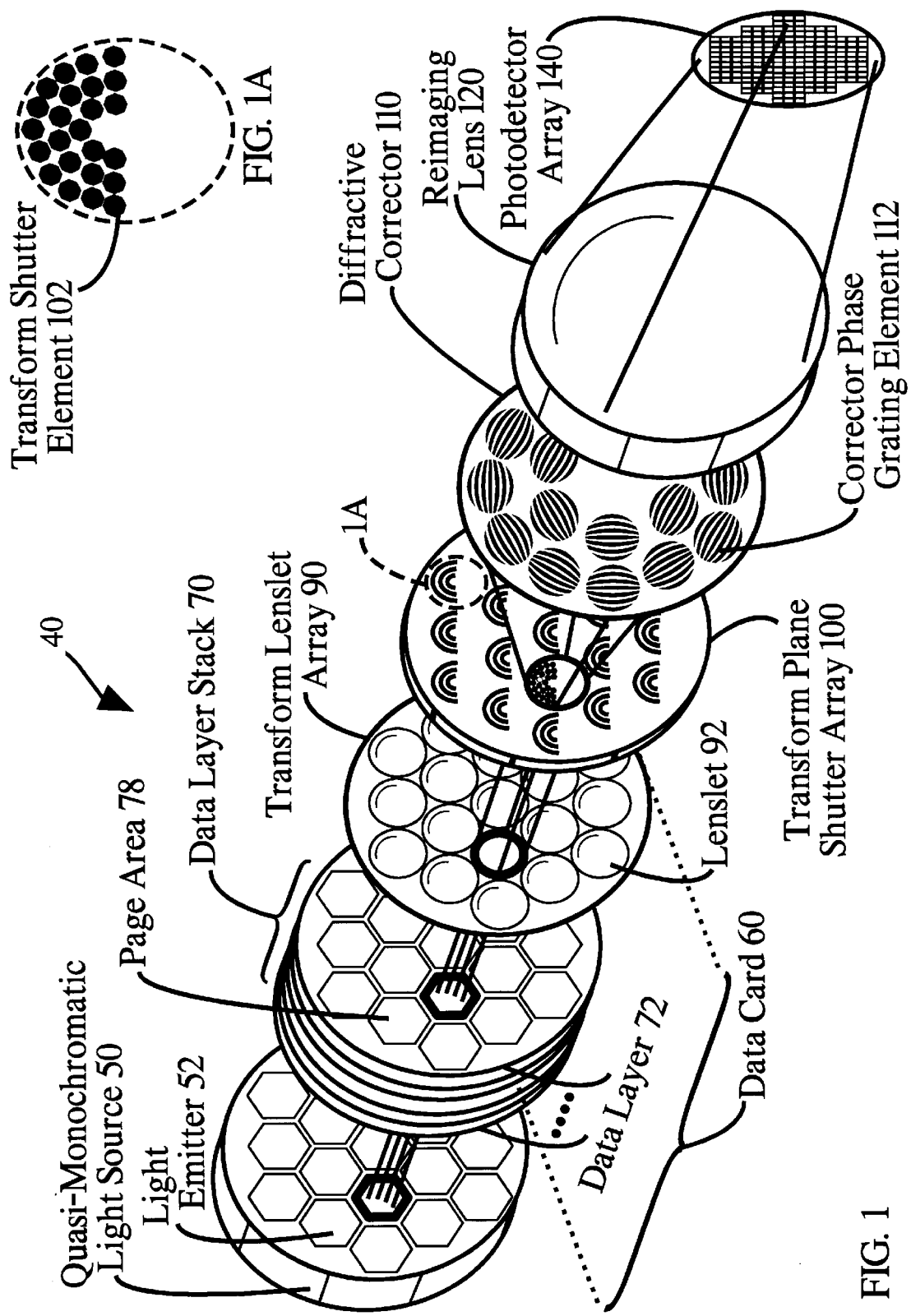

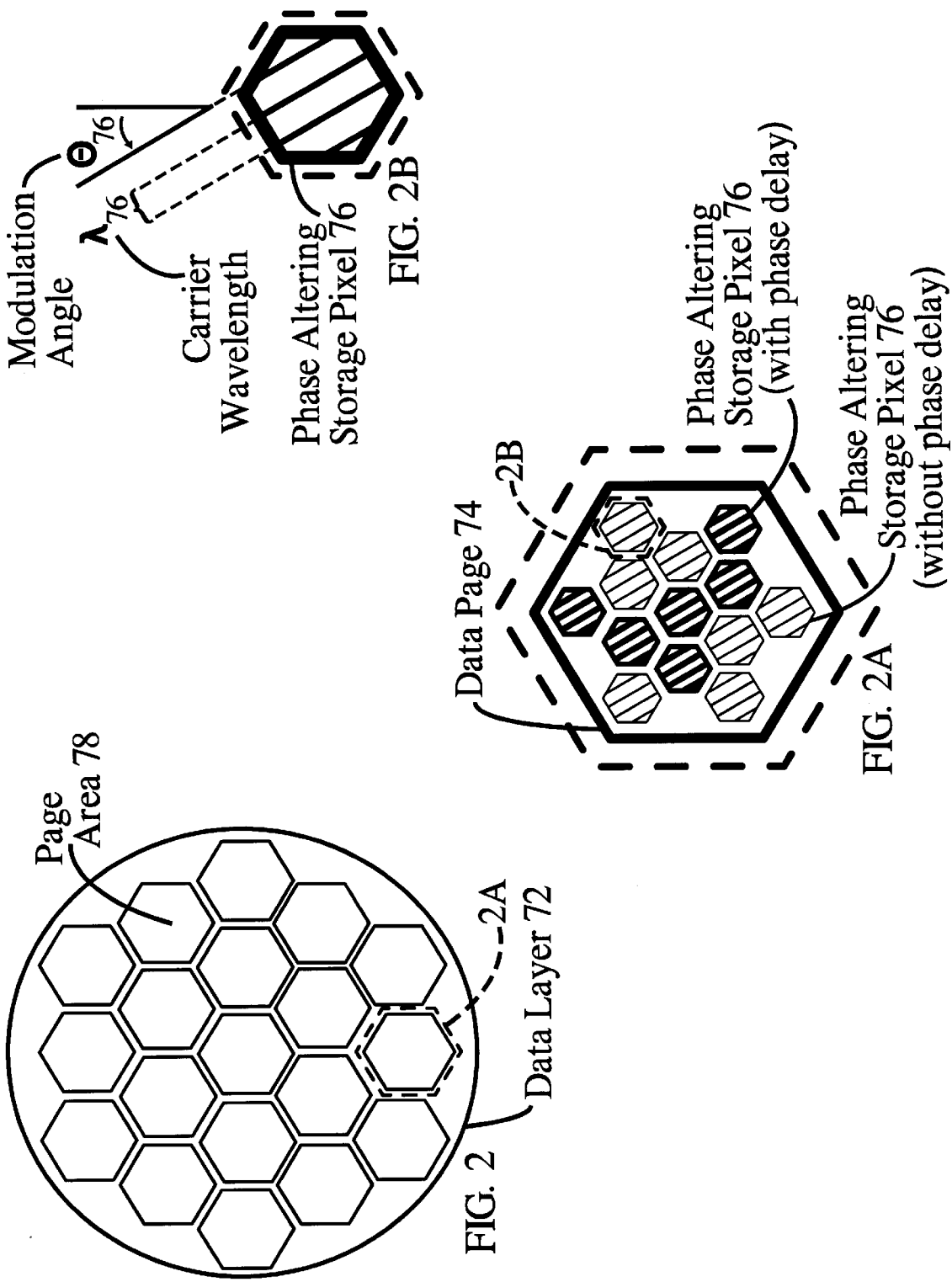

Amplitude Pattern of Information 156
Amplitude Pixel 158

Phase Altering Storage Pixel 76
Data Page 74

Page Area 78
Modulation Angle $\Theta_{170}$
Data Layer 72
Projection Lens 160
Transmission Diffractive Grating 170
Amplitude Pattern Object Plane 154
Amplitude Pattern Controller 152

PHOTOREFRACTIVE READ-ONLY OPTICAL MEMORY APPARATUS USING PHASE, FREQUENCY, AND ANGULAR MODULATION

FIELD OF THE INVENTION

The present invention, a photorefractive read-only optical memory apparatus using phase, frequency, and angular modulation, relates to the optical storage of digital data in an optical material and the fast random access retrieval of such data, and more particularly, to optical storage through carrier phase, frequency, and angular modulation.

BACKGROUND OF THE INVENTION

Optical memories of the type having large amounts of digital data stored by the optically modifying characteristics of a film or thin layer of photosensitive material and accessed by electrical addressing without mechanical movement, volumetric storage memories, have been proposed but have not resulted in wide spread commercial application. The interest in such optical recording and retrieval technology is due to its capability for fast retrieval of large amounts of data compared to that of existing electro-optical mechanisms such as optical discs and magnetic storage such as tapes and magnetic discs, all of which require mechanical motion of the storage medium.

For example, in the case of optical disc memories, it is necessary to spin the record and move a read head in a radial motion across the disc to retrieve the data, which is output in serial fashion. The serial accessing of data generally requires transfer to a buffer or to the solid state random access memory of a data processor in order to accommodate high-speed data addressing and other data operations of modern computers. Solid state Read-Only-Memory (ROM) and Random-Access-Memory (RAM) can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature. Most share a similarity of optical system design with the present invention, particularly in the source array, lenslet array, and detector array but are limited to the storage of one "page" of data at each storage location within the volumetric storage media. Much of the early work was done by James T. Russell, who disclosed a method of writing and reading serially from a two dimensional photographic record by mechanically moving a set of microlenses and a laser beam to extract the digital data in U.S. Pat. No. 3,806,643, Photographic Records of Digital Information and Playback Systems Including Optical Scanners, (1974), and U.S. Pat. No. 3,885,094, Optical Scanner, (1975).

In U.S. Pat. No. 3,898,005, High Density Optical Memory Means Employing A Multiple Lens Array, a page of information is first displayed on a "page composer" that is the source of light for writing the digital data. A single mechanical shutter is then opened allowing light to pass through one of a plurality of lenslets in an array and thereby reimage the data from the page composer onto the film. The aperture is then closed and mechanically moved to another lenslet in the array. A different page of digital information is then displayed on the page composer, the shutter is opened, and another page of data is recorded on the film.

The development of two-dimensional optical storage continued with devices such as that disclosed in U.S. Pat. No. 3,996,570, Optical Mass Memory, in which a means of recording and writing multiple storage fields "pages" within a two dimensional storage area of a recording medium is detailed. A non-mechanical means of deflecting a laser beam is described which writes digital information into a storage field "page." In the read operation, one element of an LED array is used to illuminate a particular storage field "page" and the digital information is reimaged onto a detector array.

Volumetric storage development has been limited because many of the optical memory devices have lenses or other optical structures not capable of providing the requisite data density. The optical resolution of the data image by these lens systems does not result in sufficient data density and data rate to compete with other forms of digital memory. Although certain lens systems, such as microscope objectives, used in other fields are theoretically capable of the needed resolutions, such lens combinations are totally unsuited for reading data stored in closely spaced data fields. Another difficulty encountered with existing designs is the practical effect of temperature and other physical disturbances on the mechanical relationship between the data film or layer, the lens assemblies, and the optical sensors that convert the optical data to electrical signals. For example, the thermal expansion effects of even moderate density optical memories of this type can cause severe misregistration between the optical data image and the read-out sensors. Similar difficulties are encountered in the required registration between the recording process and the subsequent reading operations. Intervening misregistration of the high-density optical components can cause significant data errors if not total loss of data.

SUMMARY OF THE INVENTION

In consideration of the problems detailed above and the discrepancies enumerated in the partial solutions thereto, an object of the present invention is to provide optical volumetric mass memory having random accessibility in a relatively compact size comparable to, or even smaller than, tape and compact disc storage mechanisms.

Another object of the present invention is to provide optical volumetric ROM at a low cost, small size, and in an implementation that uses little energy and consequently requires little heat dissipation.

In order to attain the objectives described above, according to an aspect of the present invention, there is provided a photorefractive read-only optical memory apparatus using phase, frequency, and angular modulation. The present invention relates to a device for recording and retrieving digital information, and particularly relates to a device for, and a method of, recording and retrieving binary information by altering the phase transmission characteristics of a phase recording media and further encoding the binary information in the carrier of that transmission by using carrier frequency and angular, or theta, modulation.

Much as in the two dimensional optical random access memory described by Russell in U.S. Pat. No. 5,379,266; Optical Random Access Memory, the specification and drawings of which are hereby incorporated by reference, where binary data is stored in an optical layer capable of selectively altering light by changeable transmissivity, particularly with respect to phase in a single optical layer, the present invention stores the binary data using phase recording but provides for the recording of the binary data in multiple layers of optical recording media by recording on each layer with a unique carrier frequency and phase.

Data digits are stored as phase altering spots on one of many optically transparent thin layers called photorefractive data layers. These photorefractive data layers, capable of altering the phase characteristics of the transmitted light, can be manufactured using any of the same techniques used to create transmissive holograms. The data digits are encoded as digits of phase delay information. In the recording of the digital data digits, the image of the digital data digits is carrier modulated in both frequency and angle.

Each transmissive photorefractive data layer is organized into several regions or patches, called page areas, which contain an array of juxtaposed encoded digital information data spots which together makeup one of the pages of that transmissive photorefractive data layer. Each page area on each of the transmissive photorefractive data layers may have several pages of digital information, each recorded with a different carrier frequency and carrier angle.

These several transmissive photorefractive data layers are stacked together and aligned in such a manner that one page area of each transmissive photorefractive data layer is aligned with one page area of all the other layers, and the array of juxtaposed encoded binary data spots making up each page so aligned are also aligned with each other. This stack of aligned pages from each transmissive photorefractive data layer is referred to as a book.

The carrier modulated frequency and angle is unique for any page of data stored within one book and each book recorded on the data card may contain the same carrier modulation scheme. The reason for similar carrier modulation schemes for each book is to simplify the recording process, as well as, the retrieval process.

This stack of transmissive photorefractive data layers is also aligned with an array of lenslets such that each book is aligned with one lenslet. When one of the books is selectively illuminated by a controllable light source, the lenslet aligned with that book projects transformed images of the data pages within that book, through a shutter array, discussed below, a diffractive corrector, and a reimaging lens onto an array of light sensors, called the photosensor detector array. The photosensor detector array is arranged such that each data bit within the illuminated page is projected onto a corresponding element of the photosensor detector array. When all the elements of the shutter array are closed except for those that allow the transform of one page to project, only one page of data bits will be projected onto the photosensor detector array. The photosensor detector array is deployed such that each data bit within an illuminated page, and consequently the data bit in the corresponding aligned position on each page of the book is projected, when appropriate elements of the shutter array are opened, onto one element of the photosensor detector array.

In order to allow only one page of the data book to be selectively illuminated and projected onto the photosensor detector array, a shutter array is deployed at the focal plane of the lenslet array, also known as the spatial frequency plane, located between the lenslet array and the reimaging lens. The digital information stored on each page has been recorded with a unique carrier frequency and carrier modulation angle for the purpose of separation. The lenslet associated with the particular book being illuminated transforms the digital information contained in each page of that book, and the resulting transformed data pages are projected onto the spatial frequency plane. Because the digital data on each page has been recorded with a unique frequency and angular (theta) modulation, the information representing a particular page will be transformed to two unique locations, the first order modulated components, within the spatial frequency plane and symmetric about the unmodulated carrier transform, called the DC component. The spatial frequency plane shutter array opens selective elements of its array corresponding to components of the transformed image of the particular page thereby causing only one page of a book to be imaged onto the photosensor detector array at any one time. In the simplest case, only one of the modulated components is passed with the other mirrored modulated component and the DC component blocked. This is to create an amplitude image of the stored phase modulated data page at the photodetector array. By selectively illuminating individual books and selectively opening the spatial frequency plane shutter to pass a single desired transformed page of digital data, any desired page of any desired book in the stack of transmissive photorefractive data layers can be imaged onto the photosensor detector array causing parallel electrical signals to be generated that correspond to the data stored on that particular data page.

Pages of data can thus be randomly accessed and all data on that page can be read in parallel at speeds limited only by the access speeds of the illumination source, spatial frequency plane shutter array, and photosensor detector array.

Resembling the bonded data/lens card described by Russell in the '266 patent, referenced above, a preferred form of the present invention is to fabricate the stack of transmissive photorefractive data layers, together with the lenslet array as a single structural unit or data card. As so fabricated, the optical distances and alignment of these elements are fixed within the data card and allow the data card to be used as a removable, transportable, resilient, read-only media. In this embodiment, the elements of the present invention, save those making up the data card, are implemented as a photorefractive read-only optical memory apparatus using phase, frequency, and angular modulation, using the data card as a removable and replaceable media.

The aforementioned features, objects, and advantages over the prior art will become apparent to those skilled in the art from the following detailed description and accompanying drawings.

BRIEF DESCRIPTION OF THE DRAWINGS

My invention can best be understood when reading the following specification with reference to the accompanying drawings, which are incorporated in and form a part of the specification, illustrate several embodiments of the present invention, and together with the description, serve to explain the principles of the invention. In the drawings:

FIG. 1 is an exploded operational plan view of the photorefractive read-only optical memory apparatus using phase, frequency, and angular modulation in accordance with an embodiment of the present invention.

FIG. 2 shows an example of multiple data pages at various carrier frequency and angle modulation on a single data layer in accordance with an embodiment of the present invention.

DETAILED DESCRIPTION OF THE PREFERRED EMBODIMENTS

Figure 3A:
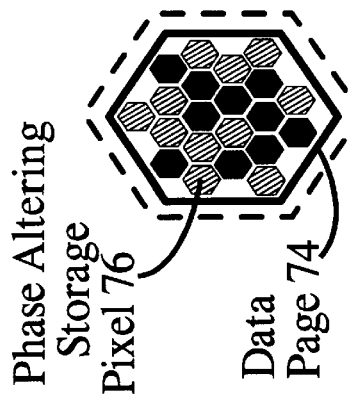
FIG. 3 is an exploded operation plan view of a recording projection system for recording individual data layers.
Figure 3B:
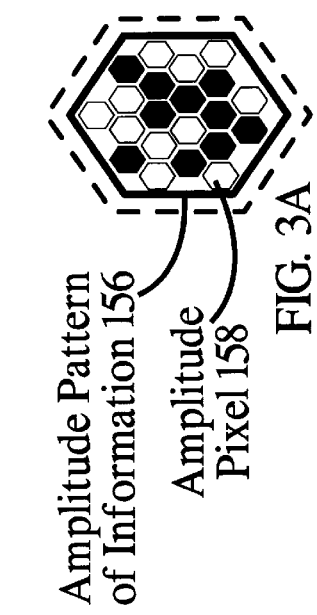

As shown in FIGS. 1 and 2, the photorefractive read-only optical memory apparatus using phase, frequency, and angular modulation 40 reads information stored as phase altering storage pixels 76 on data layers 72. These phase altering storage pixels 76 record information as a phase delay and are modulated with a particular carrier frequency and carrier modulation angle. Light from a quasi-monochromatic light source 50 is selectively made to propagate through selected portions of one or more photorefractive data layers 76. These portions of the data layers 72 are called page areas 78 and contain logical assemblages of phase altering storage pixels 76, called data pages 74. Each page area 78 contains one or more data pages 74 and each data page 74 is composed of multiple phase altering storage pixels 76 that are modulated with the same carrier frequency and carrier modulation angle and is different from the modulation of the phase altering storage pixels 76 of any other data page 74 within that page area 78 or any other page area 78 in the same position within the stack of data layers 72. As will be shown below, all of the phase altering storage pixels 76 of a particular data page 74 are usually recorded with their particular and identical modulation simultaneously, allowing us to refer to the "modulation" of a data page 74.

Figure 9:
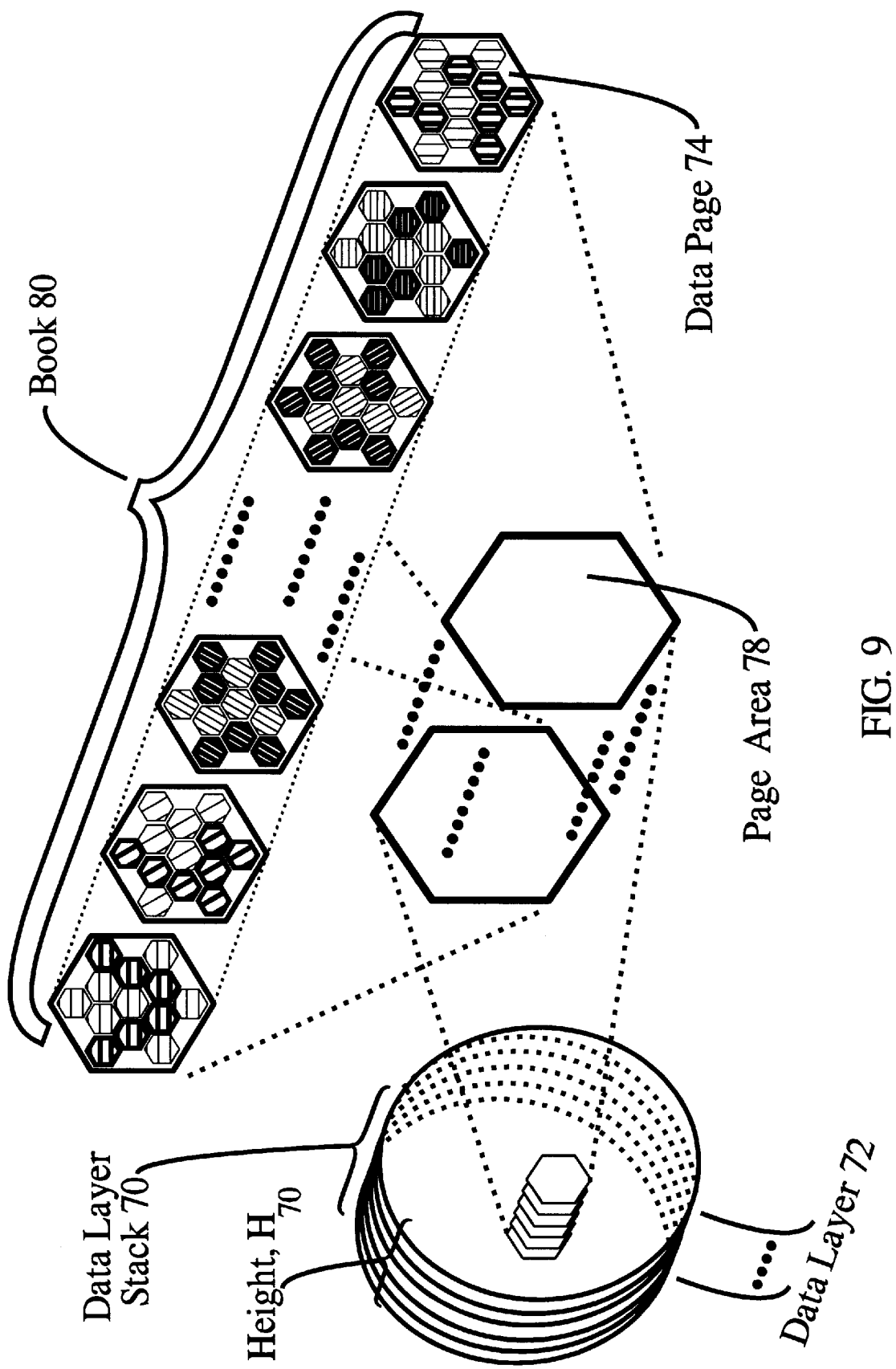
FIG. 9 is an exploded operational plan view of the arrangement of multiple data pages arranged in a book of the data layer stack in accordance with an embodiment of the present invention.

The phase altering storage pixels 76, contained in a data page 74 within a page area 78, are aligned, in the direction of light propagation of the quasi-monochromatic light source 50, with the corresponding phase altering storage pixels 76 of all other pages, if any, in that page area 78 and the corresponding page areas 78 of other data layers 72, if any, aligned with that page area 78. This alignment of data layers 72 is called the data layer stack 70 and the resulting alignment of data pages 74 in the aligned page areas 78 of the data layer stack 70, as shown in FIG. 9, is called a book 80.

Figure 4:
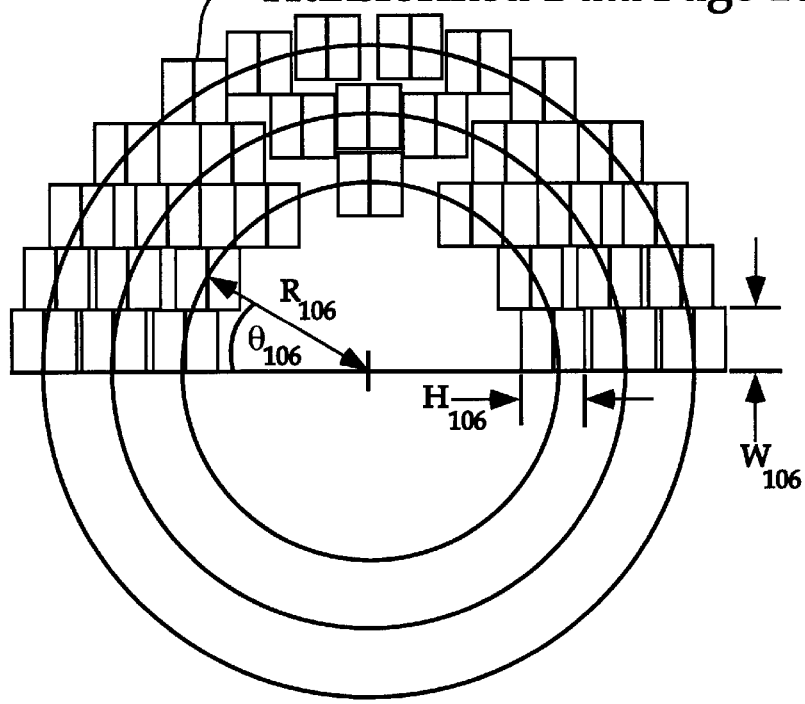
FIG. 4 depicts a representation of the projection of transformed data pages in the spatial frequency plane in accordance with an embodiment of the present invention.

After propagating through a selected book 80, the light from the quasi-monochromatic light source 50 passes, or is projected through, that lenslet 92 of the transform lenslet array 90, aligned, in the direction of propagation, with the selected book 80. The different modulations of the multiple data pages 74 making up the selected book 80 cause the transforms of each data page 74 in the selected book 80 (the transformed data pages 106) to be projected by the aligned lenslets 92 onto unique locations within the spatial frequency plane 104 unique amongst pages of the selected book 80, as shown in FIG. 4.

A transform plane shutter array 100, composed of multiple transform shutter elements 102, is deployed in the plane of the spatial frequency plane 104 and arranged such that by opening selected frequency plane shutter elements 102, only the transform of one desired data page 74, or transform page 106, is allowed to propagate through the transform plane shutter array 100.

The data layers 72 can be manufactured using many of the processes used to create transmissive holograms. Two of these processes that are most applicable are using a photorefractive material or the bleaching of photographic emulsions. The data layer 72 may be made directly of a photorefractive material, such as lithium niobate, barium titanate, bismuth silicon oxide, bismuth germanium oxide, potassium tantalum niobate, or strontium barium nitrate. Information may be recorded directly on data layers 72 made of these materials by projecting an amplitude-modulated image of the information onto the photorefractive material and subsequently fixing the material. The chief difficulty in using photorefractive materials is that often the light used to read the recording stored in such materials will alter the recording. As techniques for fixing photorefractive materials are not yet well developed, most photorefractive recording and playback is accomplished using a wavelength to which the material is sensitive for recording and a wavelength to which the material is not sensitive for playback.

Another technique for creating the data layer 72 is to use a photopolymer film for the photorefractive material. This technique is well described by Joseph W. Goodman in "Introduction to Fourier Optics," pp. 347–8 (1996). These films provide a recording medium with major advantages. The photopolymer films can be made very thick, have excellent efficiency, and are not sensitive to light once fixed. The modulation mechanism for these photopolymer films is a combination of thickness variation and internal refractive index change. The film is made from a photopolymerizable monomer that experiences polymerization or cross-linking under exposure to light. After the initial polymerization of the portions of the monomer exposed to light, diffusion of the remaining monomer takes place away from areas of high concentration (low exposure). A final uniform exposure polymerizes the remaining monomer, but due to the previous diffusion, the distribution of polymer is now non-uniform, leading to the phase modulation properties of the material.

With today's current technology, a preferred embodiment for manufacturing the data layers 72 is the use of a bleaching technique on a silver halide emulsion film that has been exposed by an amplitude modulation representation of the information to be recorded (see Id. pp. 183–4). Conventional photographic emulsions modulate light primarily through absorption, caused by metallic silver present in the transparency. As a consequence, significant amounts of light are lost when an optical wave passes through such a spatial modulator. A bleaching agent is used to remove this metallic silver from the emulsion leaving in its place either an emulsion thickness variation or a refractive index variation within the emulsion. The chemical processes that lead to these phenomena are tanning and non-tanning bleaching. A thickness variation occurs when a tanning bleach is used, while a refractive index modulation occurs when a non-tanning bleach is used.

In using the tanning bleach technique, the chemical agents used release chemical by-products as they remove the metallic silver, and these by-products cause cross-linking of the gelatin molecules within the film emulsion in regions where the silver concentration was high. As the film is dried, the hardened areas having higher density shrink less than the unhardened areas having lower density, resulting in a relief image, with the thinnest regions where the density was lowest.

Non-tanning bleaches produce internal refractive index changes within the emulsion, rather than relief images. The metallic silver in this method is changed back by chemical bleaching to a transparent silver halide crystal, with a refractive index larger than the surrounding gelatin emulsion. Additionally, the bleach must remove the sensitizing agents found in unexposed silver halide crystals to prevent them from turning to metallic silver due to thermal effects and additional exposure to light.

The data layers 72 are constructed of photosensitive materials capable of storing light altering characteristics such that the phase of transmitted light is altered, in accordance with the information coding of a phase altering storage pixel 76, when passing through that phase altering storage pixel 76. Although the information coding scheme used can allow for the encoding of information into any number of discrete phase delays, in the preferred embodiment, binary encoding is used with the phase altering storage pixel 76 encoding either a phase delay or no phase delay.

In the preferred embodiment, the phase altering storage pixels 76 are arranged on the data layer 72 in logical storage field assemblages, called data pages 74. Each data layer 72 has one or more data pages 74 arranged into a pattern that minimizes unused space on the data layer. One or more data pages 74, each modulated with a carrier frequency and carrier modulation angle, unique for that page area 78, and unique for the corresponding page areas 78 for all data layers 72 in the data layer stack 70, are written into the same page area 78 on a single data layer 72 as shown in FIG. 2.

Figure 3:
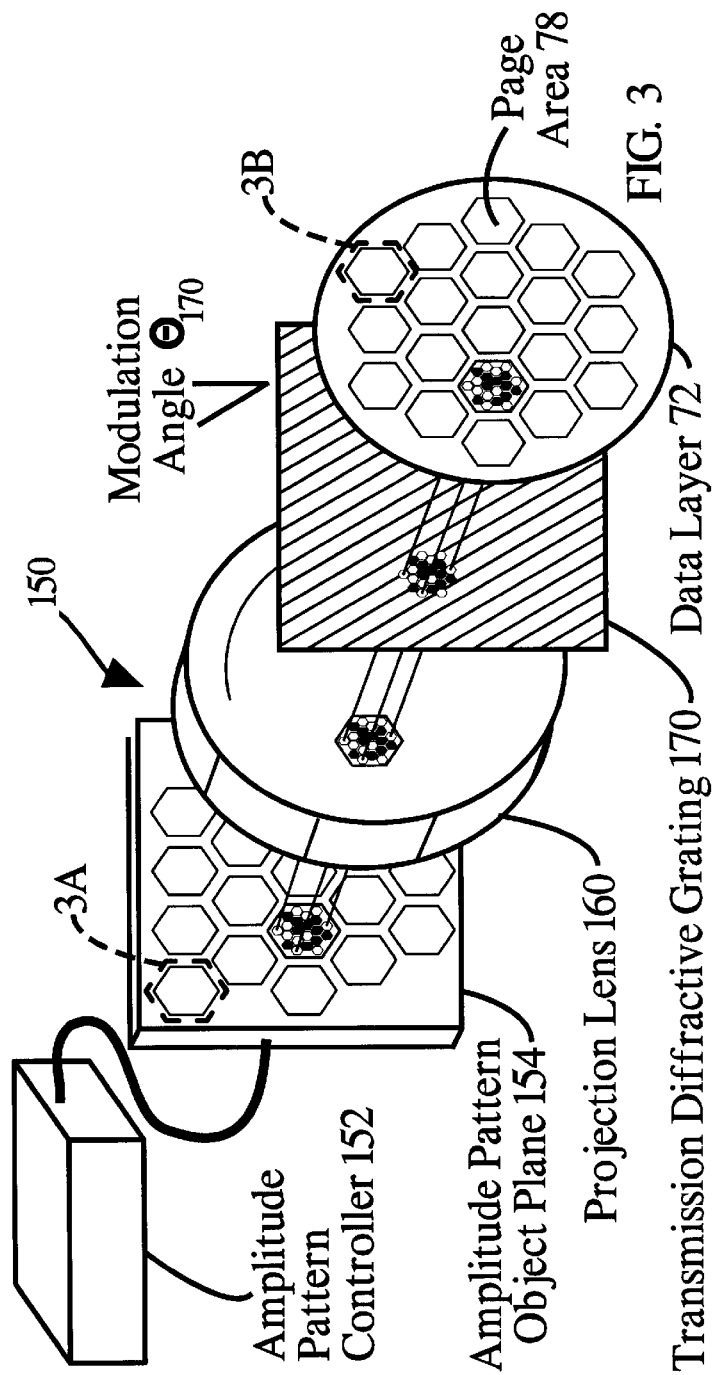

In most data layer 72 manufacturing techniques, all of the data pages 74, separated spatially on the data layer 72 and modulated with the same carrier frequency and carrier angle are simultaneously written into multiple page areas 78, one data page 74 per page area 78. As shown in the recording projection system 150 in FIG. 3, the information to be recorded must first be encoded and represented as a two dimensional digital pattern of light amplitude, called the amplitude pattern of information 156. In a binary encoding embodiment, this amplitude pattern of information 156 representation of the information is a pattern of black and white locations representing the binary or digital information. In other encoding schemes where more information is to be stored in each phase altering storage bit 76, the information is represented by the amplitude pixels 158 as encoded on a gray scale.

The amplitude pattern of information 156 is modulated with a specific carrier frequency and carrier angle for recording on the data layer 72. There are several ways to modulate the amplitude pattern of information 156. As shown in the recording projection system 150 in FIG. 3, perhaps the simplest method is to project the image of the amplitude pattern of information 156 through a transmission diffraction grating 170 onto the photosensitive recording material. This method is further described in "Physical Optics Notebook: Tutorials in Fourier Optics," pp. 445–450. In so doing, the amplitude pattern of information 156 is recorded as phase altering storage pixels 76 modulated with the selected carrier frequency and carrier angle. The transmission diffractive grating 170 is chosen to match the specific carrier frequency desired and rotated to the angle of modulation specified. In the recording projection system 150, shown as an example, the amplitude pattern of information 156 is encoded by an amplitude pattern controller 152 that causes the amplitude bits 158 to be illuminated to an intensity corresponding to the binary or gray scale representation of the information being recorded. The amplitude pattern of information corresponding to each data page 74 is displayed on an amplitude pattern object plane 154 and projected by means of a projection lens 160, through a transmission diffractive grating 170 onto one of the photorefractive data layers 72.

The carrier frequency is chosen such that the fundamental frequency of the transmission diffractive grating 170 is at least twice the bandwidth of the amplitude modulated representation of the information, thereby satisfying the sampling theory and ensuring that all the information content of the phase altering storage bits 76 is properly sampled and stored on the data layer 72.

In the preferred embodiment, one of the data pages 74 within each of the spatially separated books 80 of the data card 60 are each recorded with the same carrier frequency and carrier angle. This allows the amplitude patterns of information 156 corresponding to one of the data pages 74 for each book 80 to be projected and recorded simultaneously.

The number of data pages 74 that can be stored in one page area 78 will be limited by the resolution and linear exposure dynamic range of the data layer 72 recording media. The greater the linear exposure dynamic range and resolution of the data layer 72 recording media, the greater the number of data pages 74 that can be stored in each page area 78. To minimize the distortion of the data pages 74 that are recorded in one page area 78, a linear relationship must exist between the amplitude transmittance of the developed image of the data page 74 and the input exposure. Deviations from this linear region of the D-log E curve for the recording media produce non-linearities that distort the spatial frequency spectrum of the desired recorded data page 74. For linear processing to occur, the gamma (γ), or slope of the D-log E curve, for the recording media must be equal to −2. The negative sign of gamma means that a reversal is required so that the resulting recorded data pages 74 are a photographic positive.

To maximize the number of data pages 74 that can be recorded in one page area 78 while maintaining linearity during recording, the contrast of the data page 74 must be minimized. The available linear exposure dynamic range of the recording media limits the total number of data pages 74 that can be recorded. The total input linear exposure dynamic range is defined as:

$$10\log\left(\frac{E_{T_{MAX}}}{E_{T_{MIN}}}\right) = 10\log\left(\frac{E_{1_{MAX}}}{E_{1_{MIN}}} + \frac{E_{2_{MAX}}}{E_{2_{MIN}}} + \ldots\right), \quad \text{Eq. 1}$$

where $E_T$ represents the sum total exposures of the individual exposures, $E_1 \ldots E_N$, and the MAX/MIN ratios represent the contrast ratio used for each exposure.

If all the exposures have the same dynamic range, the equation reduces to:

$$10\log\left(\frac{E_{T_{MAX}}}{E_{T_{MIN}}}\right) = 10\log\left(\frac{E_{1_{MAX}}}{E_{1_{MIN}}}\right) + 10\log N, \quad \text{Eq. 2}$$

where N is the total number of exposures for a given data layer 72.

If binary data is used, then a contrast ratio of only 2:1 is necessary to discern a binary "1" from a binary "0" at the photodetector array 140. For example, assuming the recording media has an input linear exposure dynamic range of 23 dB, near the limit of current science, the total number of exposures N takes a specific value. The equation used to determine the total number of exposures, N, that can be recorded on one data layer 72 is:

$$23 \text{ dB} = 3 \text{ dB} + 10 \log N_{74}. \quad \text{Eq. 3}$$

Thus, 100 different data pages 74 can be linearly recorded at one page area 78 on one data layer 72, using a recording media with a total exposure dynamic range of 23 dB, and using 3 dB per exposure.

Mathematically, we represent one carrier-modulated data page 74 recorded on the data layer 72 recording media as the product $$I_{im}(\xi,\eta) = I_{ob}^{BL}(\xi,\eta) P(\xi,\eta) \qquad \text{Eq. 4}$$

where $\xi$ and $\eta$ are the coordinates within image space, $I_{im}(\xi,\eta)$ represents the recorded image of the data page 74 (assumed to be linear with a $\gamma=-2$ film developing process), $I_{ob}^{BL}(\xi,\eta)$ is a band-limited data page 74 which has been low-pass filtered by the transfer function of the projection lens during recording, and $P(\xi,\eta)$ is the transmission function of the periodic sinusoidal diffraction grating rotated at a specific angle $\Theta$.

By rotating the grating by an angle of $\Theta$ between each exposure such that $N_{74} \Theta = \Pi$, where $N_{74}$ is the number of bandlimited data pages 74, and $\Theta$ is the angular rotation of the grating, multiple data pages 74 can be stored in one location of the page area 78. By exposing the recording media sequentially with different data pages 74 modulated at different angles and spatial frequency, the resultant recorded image can be mathematically represent by:

$$I_{im}(\xi,\eta) = I_{ob}^{(1)}(\xi) P^{\Theta_1}(\xi) + I_{ob}^{(2)}(\xi) P^{\Theta_2}(\xi) + \ldots + I_{ob}^{(N)}(\xi) P^{\Theta_N}(\xi) \qquad \text{Eq. 5}$$

where $I_{ob}^{(N)}(\xi,\eta)$ represents the $N^{th}$ data page 74 used in the recording and $P^{\Theta_N}(\xi,\eta)$ represents the orientation of the sinusoidal diffraction grating in the $N^{th}$ exposure.

If the linear input exposure dynamic range of the recording media were unbounded, then the resolution of the recording media would determine the maximum number of data pages 74 that could be stored in the recording media. The spatial frequency of the sinusoidal carrier, $\omega_c$, modulating the data page 74 during recording needs to be greater than twice the highest spatial frequency, $\omega_{im}$, of the data page 74. If the spatial frequency of the carrier is less than this value, the data pages 74 will overlap during recording and will not be completely recovered. This degradation of the unrecovered data pages is caused by aliasing. The highest spatial frequency of the carrier that can be used to modulate the data page 74 must be less than the maximum spatial frequency that the recording media can satisfactorily record, $\omega_{rm}$. The equation that describes this is:

$$\omega_{rm} > \omega_c > 2\omega_{im}. \qquad \text{Eq. 6}$$

The overall number of data pages 74 that can be stored in one page area 78 by using angular modulation can be determined by calculating the circumference of the circle in the spatial frequency plane 104 whose radius is less than the maximum recording media carrier frequency, $\omega_{rm}$, that can be stored in the recording medium at a modulation of 50%. Only half of this circumference can be used to store different carrier-modulated images because of the diffraction symmetry in the spatial frequency plane 104. Dividing this available circumference by the image bandwidth $\omega_{im}$ yields the number, $N_{74}$, of data pages 74 that can be stored in one page area 78, represented mathematically by the equation:

$$N_{74} = \frac{\pi \omega_c}{\omega_{im}}, \qquad \text{Eq. 7}$$

In addition, the number of data pages 74 stored in the recording media can be increased by utilizing multiple carriers to fill in the spatial frequency plane 104 as shown in FIG. 4. In this application, however, because of the large number of data pages 74 involved, one must be careful not to exceed the dynamic range of the recording medium; otherwise, the process becomes nonlinear. The maximum number of data pages 74 stored in one location, $N_{74}$, can be achieved, where $$N_{74\text{MAX}} \cong \frac{1}{2} \left[ \frac{\pi \omega_c^2 - \pi \left(\frac{\omega_c}{2}\right)^2}{\pi \left(\frac{\omega_{im}}{2}\right)^2} \right] = \frac{3}{2} \frac{\omega_c^2}{\omega_{im}^2}, \qquad \text{Eq. 8}$$

by using both angular modulation and frequency modulation of the carrier.

In the preferred embodiment the quasi-monochromatic light source 50 is comprised of an array of light emitters 52 such as Light Emitting Diodes (LEDs) or laser diodes arranged in a configuration that complements the arrangement of the page areas 78, which in this embodiment, are in the hexagonal cellular pattern shown in FIG. 2. The quasi-monochromatic light source 50 is mounted on a common integrated circuit board or other structural unit, which allows each of the light emitters 52 to be closely spaced. The integrated circuit board is designed such that any one of the light emitters can be energized through the proper electronic addressing scheme. The bandwidth of the light emanating from any one of the emitters should be sufficiently narrow so that aberrations caused by a broad band of wavelengths can be minimized. As an example, an LED that has a full-width at half maximum bandwidth of about 20 nm is sufficiently narrow. Laser diodes also typically have bandwidths sufficiently narrow for use as the quasi-monochromatic light source 50. It should also be noted that if the optical design is light limited, the wavelength of light chosen is typically that wavelength that the photodetector is most sensitive to. In the case of silicon detectors, this wavelength would be about 800 nm. In addition, the light projecting from each of the light emitters 52 is collimated such that the rays within the light beam are parallel.

The quasi-monochromatic light source 50 is located directly adjacent the data card 60. Each of the light emitters 52 within the source array is aligned with a page area 78 on the data card 60. The light emanating from a particular light emitter 52 uniformly covers the entire page area 78 aligned with that light emitter 52. In addition, the quasi-monochromatic light produced by the light emitter 52 is collimated so as to minimize stray light. This can be accomplished by placing a source-imaging lens adjacent to the light emitter 52 prior to the data card 60. To provide the best collimation, the source-imaging lens is concentrically located at its focal length after the light emitter 52 but prior to the data card 60. Each light emitter 52 can have a source-imaging lens concentrically located between the light emitter 52 and the page area 78 on the data card 60. The size of the individual light emitters 52 do not exceed the size of the page areas 78. Typically, this would be about 1 mm².

The optical architecture for the quasi-monochromatic light source 50 can take on a number of different configurations. The quasi-monochromatic light source 50 could be constructed using diode emitters, lasers, or LEDs, and a source-imaging lens, and light shutter array. In other embodiments the quasi-monochromatic light source 50 illuminates all books 80 simultaneously, relying on the transform plane shutter array 100 alone to select the data page 74 of interest. The quasi-monochromatic light source 50 is capable of emanating light at selected wavelengths in some embodiments. This allows transformed data pages 106 to appear at different radial positions on the spatial frequency plane 104 as a function of quasi-monochromatic light source 50 emanated wavelength, which can be used to limit the necessary size of the transform plane shutter array 100 and diffractive corrector 110.

Figure 7:
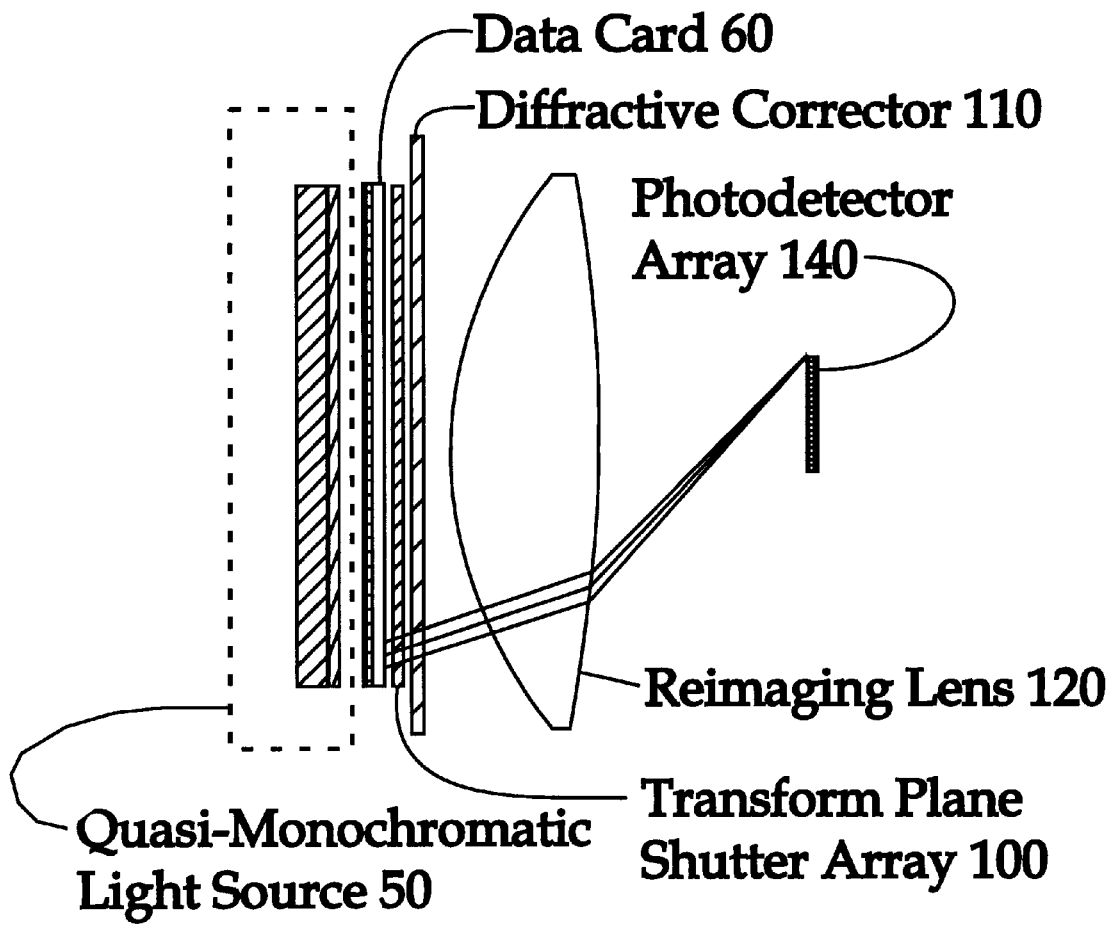
FIG. 7 is a schematic diagram of the optical arrangements of the principal components of the apparatus in accordance with an embodiment of the present invention.
Figure 8:
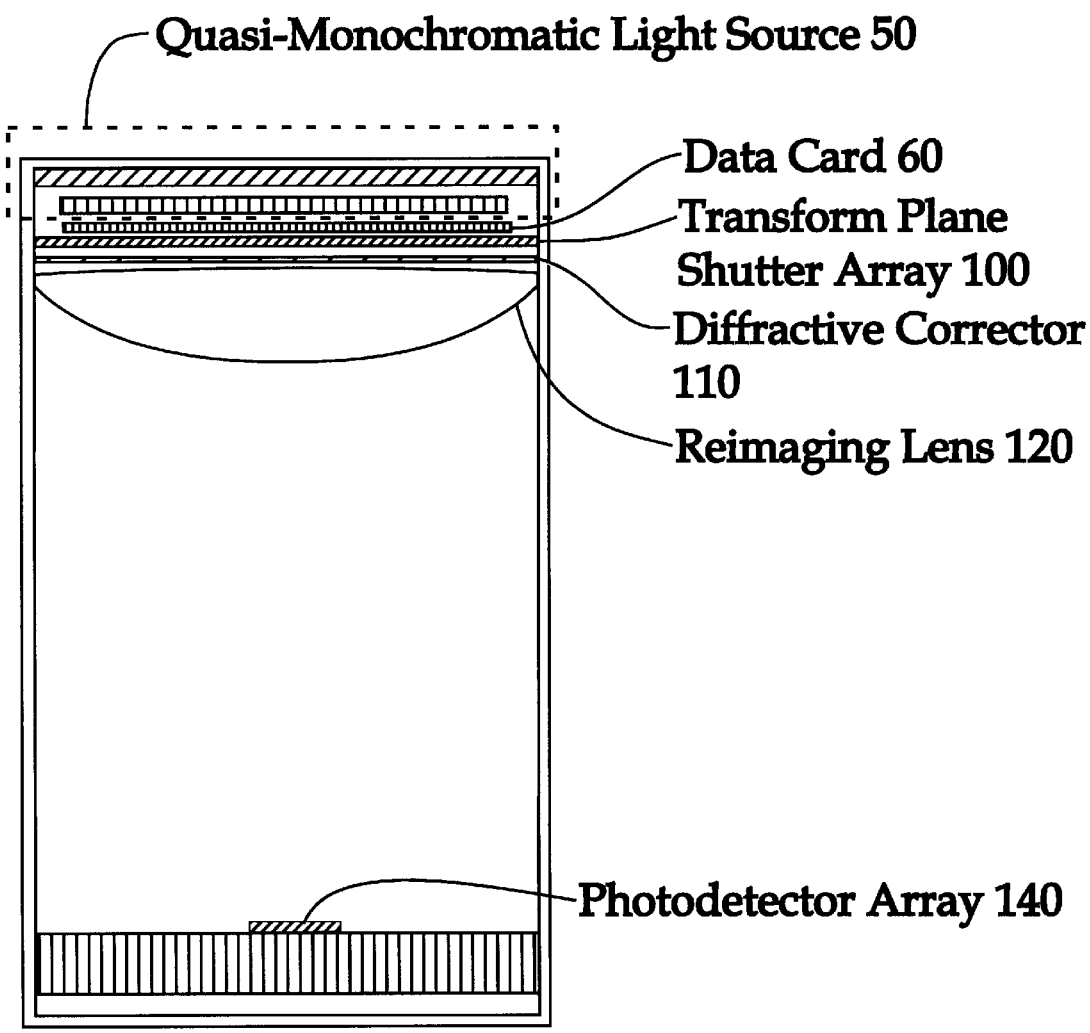
FIG. 8 is a section view of an embodiment of a photorefractive read-only optical memory apparatus using phase, frequency, and angular modulation in accordance with the present invention.

As shown in FIGS. 7 and 8, immediately optically following and coaxially located with the quasi-monochromatic light source 50, a data card 60 is removably mounted within the data card reader. The data card consists of a plurality of data layers 72 and an integrated transform lenslet array 90. Each data layer 72 contains several page areas 78 organized tightly together to minimize unused space. The preferred shape of the page areas 78 is hexagonal to efficiently use the clear aperture of the lenses within the transform lenslet array 90. Several data pages 74 are stored within each page area. Each data page 74 is encoded or modulated with a unique carrier oriented at a particular angle. Multiple data layers 72 can be stacked and bonded in close proximity to adjacent data layers so that maximum storage density can be achieved without being limited by the input exposure dynamic range of the recording media of a particular data layer 72. The page areas 78 on each successive data layers 72 are coaxially aligned and organized in an identical array pattern. The data layers 72 are bonded and stacked such that the height of the stack 70, $H_{70}$, does not exceed the depth of field of lenslet 92. Each data page 74 has the digital data capable of selectively altering light stored in phase.

The transform lenslet array 90 is bonded to the data layer stack 70 and has a plurality of lenslets aligned in precise, fixed optical registration with each page area 78. The data card 60 is fabricated as a bonded unit so that the transform lenslet array 90 is fixed in spatial relations to the data layer stack 70 and so that the data card 60 is readily removable as a media unit. In addition, the data card 60 has registration indicies for proper alignment with the lens system. This bonded data card 60 minimizes the adverse optical effects of differential thermal expansion between the data layer 72 and the transform lenslet array 90 and allows for an exceedingly dense data pattern. Another aspect of the preferred shape of the transform lenslet array 90 is that the first surface of each lenslet 92, adjacent the data layer stack 70, is aspherically contoured to enhance the optical resolution of the exceedingly small phase altering storage pixel 76 that is to be imaged onto a particular sensor within the photodetector array 140. The data layer stack 70 and the integrated transform lenslet array 90 can be fabricated at a cost that allows the structure to be made efficiently and effectively used as a replaceable data card.

The design of the page areas 78 are most efficient if the shape is circular so that the diameter of each page area 78 makes maximum use of the available lens imaging power. An excellent explanation and development of this concept is found in U.S. Pat. No. 5,696,714, Optical Random Access Memory. If, however, the lenslets 92 within the transform lenslet array 90 and page areas 78 are arranged in a regular array of columns and rows, there will be a fraction of area lost in the corners between the circular page areas 78.

The present invention is preferably embodied by designing each of the page areas 78 of the data layers 72 in a close-packed cellular pattern, for example hexagonal as shown in FIG. 2. Each page area 78 is filled with phase altering storage pixels 76 up to a maximum density as shown in the enlarged fragmentary view of a single data page 74 in FIG. 2. Thus, the hexagonal shape of the page areas 78 serves to accommodate maximum density of data and efficient use of the circular shape of lenses. As noted in the discussion of the quasi-monochromatic light source 50, since the page areas 78 are hexagonally shaped, the individual lights emitters 52 should also be hexagonal in shape to complement the shape and configuration of the page areas 78 within the data layer 72.

In bonding the data layer stack 70 to the transform lenslet array 90, a filler material such as a transparent polymer (i.e. plastic) is used. This filler material has an index of refraction that is greater than 1.0 to provide the needed angle to resolve each phase altering storage pixel 76 and is different from the index of the lenslet 92 material, which is preferably glass, in order to define the first surface of the lenslet 92. The filler material also serves to bond and hence fix the relative optical spacing of the transform lenslet array 90 relative to the data layer stack 70. Also, bonding the transform lenslet array 90 directly to the data stack 70 helps to minimize misregistration and misalignment of the optics due to thermal expansion.

To resolve the phase altering storage pixels 76 within the data layer 72 of the data card 60, the numerical aperture (NA) of each lenslet 92 must be in the range 0.35 to 0.6 5for a 1 micron phase altering storage pixel 76 size. The use of known multi-element objective lenses is impractical to adopt because of cost, physical size, and space requirements. The transform lenslet array 90 is composed of a continuous layer of high index glass or other refractive material having contoured optical surfaces of the lenslets 92 molded or otherwise formed thereon in a close-packed array. The first surface of each lenslet 92 is located approximately one diameter of the data field from the data stack 70. In addition, the diameter of the page area 78 is equal to the field of view of the lenslet 92. To reduce unwanted lens aberrations, the first surface of each lenslet 92 is made strongly aspheric. The second surface of each lenslet 92, adjacent to the transform plane shutter array 100, are spherical convex and in axial optical alignment with the aspherical first surface. The thickness of each lenslet 92 along its optical axis is roughly the same dimension as the field diameter of a page area 78 (i.e. 0.8 to 1 mm). Coaction of the lenslet 92 first surface with the second surface provides the primary imaging and aberration correcting optical power of the device. Several architectures are explored by Russell, in the '266 and '714 patent, referenced above, regarding the optical specifications of the transform lenslet array 90, diffractive corrector 110, and imaging lens 120. This data can be used by a person skilled in the art to calculate various aberrations such as spherical, coma, distortion, astigmatism, and field curvature using ray trace programs.

In operation, when a particular light emitter 52 within the quasi-monochromatic light source 50 is energized, collimated quasi-monochromatic light is projected through the corresponding book 80 onto the data card 60, and the data pages 74 stored within the book 80 are transformed at the spatial frequency plane 104 located at the focal plane of lenslet 92. The spatial frequency plane 104 is located a distance $f_{92}$ from the transform lenslet array 90. In particular, a Fourier transformation occurs and is described by the mathematical equation:

$$I(x, y) = \int\int_{-\infty}^{\infty} I_{im}(\xi,\eta) e^{\frac{-j2\pi}{\lambda f}} d\xi d\eta, \qquad \text{Eq. 9}$$

where $I_{im}(\xi,\eta)$ represents the sum of stored modulated phase images of the data pages 74, I(x,y) represents the Fourier transform of $I_{im}(\xi,\eta)$ located at the lenslet's 92 spatial frequency plane 104, $\lambda$ represents the optical wavelength, and $f_{92}$ is the focal length of the lenslet 92. As noted previously, there are N phase modulated data pages 74 stored within a book 80 located at each of the page areas 78 on the data card 60. The multiply recorded exposed image is mathematically represented by:

$$I_{im}(\xi, \eta) = \sum_{N=1}^{M} I_{ob}^{N}(\xi, \eta) P^{\ominus_N}(\xi, \eta), \qquad \text{Eq. 10}$$

where $I_{ob}^{N}(\xi,\eta)$ represents the $N^{th}$ data page stored on the film or other recording media, $P^{\ominus_N}(\xi,\eta)$ represents the period and orientation angle of the $N^{th}$ grating exposure, and M is the maximum number of stored data pages 74 within one book 80.

A more precise mathematical description is provided by Mueller in "Linear Multiple Image Storage," Vol. 8, No. 2, Applied Optics, pp. 267–273. In the preferred embodiment, a sinusoidal grating is used because it provides higher efficiency and only first diffraction orders. Mueller describes the use of rectangular rulings for the grating. This type of grating would provide multiple higher orders and lower efficiency. Using a sinusoidal grating, the transform of one data page 74 will provide a +1 diffraction order, a −1 diffraction order, and a DC component. These identical diffraction orders are located axially symmetric with respect to each other. The DC component is located on the optical axis. Provided the images of the data pages 74 are stored properly according to the sampling theorem, the transforms for each page of data pages 74 will be spatially separated in the spatial frequency plane 104 as shown in FIG. 4. Note that only the +1 diffraction order is used; the −1 diffraction order and the DC component are blocked. This is necessary to convert the phase image into an amplitude image at the photodetector array 140. For instance, if 95 data pages 74 were written onto one book 80 on the data card 60, then there would be 190 transformed data pages 106 within the spatial frequency plane 104 of the lenslet 92, each containing information about one data page 74. However, there are only 95 different transformed data pages 106 so the other 95 identical transformed data pages 106 need not be used. It is important to note that none of the transformed data pages 106 within this the spatial frequency plane 104 overlap because the proper grating angles and grating periods were used in the recording process. The equations that govern the size and radial location of each of these transformed data pages 106 locations are provided here.

$$\text{Height}_{106} = \text{Width}_{106} = \frac{(F_{92})(\lambda_{50})}{S_{74}}; \qquad \text{Eq. 11}$$

where $F_{92}$ is the focal length of the lenslet 92, $\lambda_{50}$ is the wavelength of quasi-monochromatic light source 50, and $S_{74}$ is the spacing of the phase altering storage pixels 76 within a data page 74.

$$\text{Radial Position}_{106} = \frac{(F_{92})(\lambda_{50})}{S_{74}}; \qquad \text{Eq. 12}$$

where $F_{92}$ is the focal length lenslet 92, $\lambda_{50}$ is the wavelength of quasi-monochromatic light source 50, and $P_{76}$ is the period of the carrier wavelength as recorded on the phase altering storage pixels 76 of a data page 74.

Also within spatial frequency plane 104 is a diffractive corrector 110 containing corrector phase grating elements 112 of the thick-phase holographic type, known in the optical community as a kinoform. Such a corrector phase grating element 112 is essentially a set of phase gratings set at various azimuth angles and periods. The purpose of the diffractive corrector 110 is to realign the oblique ray bundles of light after being angularly diffracted by the gratings within the data card 60. If the light ray bundles were not corrected the data pages 74 would not be properly reimaged onto the photodetector array 140. In addition, the non-corrected ray bundles may even miss the reimaging lens 120 entirely. The thick-phase holographic gratings are preferred for their high efficiency, accuracy, and low scattered light levels. At each transformed data page 106 location in the spatial frequency plane 104, a unique corrector phase grating element 112 is placed that is identical in period and angle to the grating used in recording that data page 74 in the data card 60. This corrector phase grating element 112 then causes the rays to be redirected and be aligned parallel to the optical axis of the lens system. It should be noted that the size of each corrector phase grating element 112 is limited to the size of the transformed data page 106.

The transform plane shutter array 100 consists of a plurality of independently controlled and electronically addressed shutter elements 102 arranged in a predetermined pattern that corresponds to the locations of the transformed data pages 106. The transform plane shutter array 100 is located at the focal plane of the lenslets 92 and controls the passage of the quasi-monochromatic light from the various transformed data pages 106. Only light from one of the many transformed data pages 106 is passed through a shutter element 102 of the transform plane shutter array 100 at any one time. The purpose for blocking the quasi-monochromatic light of all but one of the transformed data pages 106 is to avoid multiple data pages 74 from being reimaged onto the photodetector array 140 simultaneously. The transform plane shutter array 100 is electronically controlled through a register, which in turn is controlled by a computer. The computer energizes a particular light emitter 52 within the quasi-monochromatic light source 50 and the light is projected through the corresponding book 80 of data and its corresponding lenslet 92. The various data pages 74 are then transformed at various spatial locations in the spatial frequency plane 104. The computer then opens a particular shutter element 102 in the transform plane shutter array 100, deployed in the spatial frequency plane 104, and corresponding to the desired transformed data page 106. The light then passes through the shutter element 102 and is reimaged onto the photodetector array 140.

Figure 5:
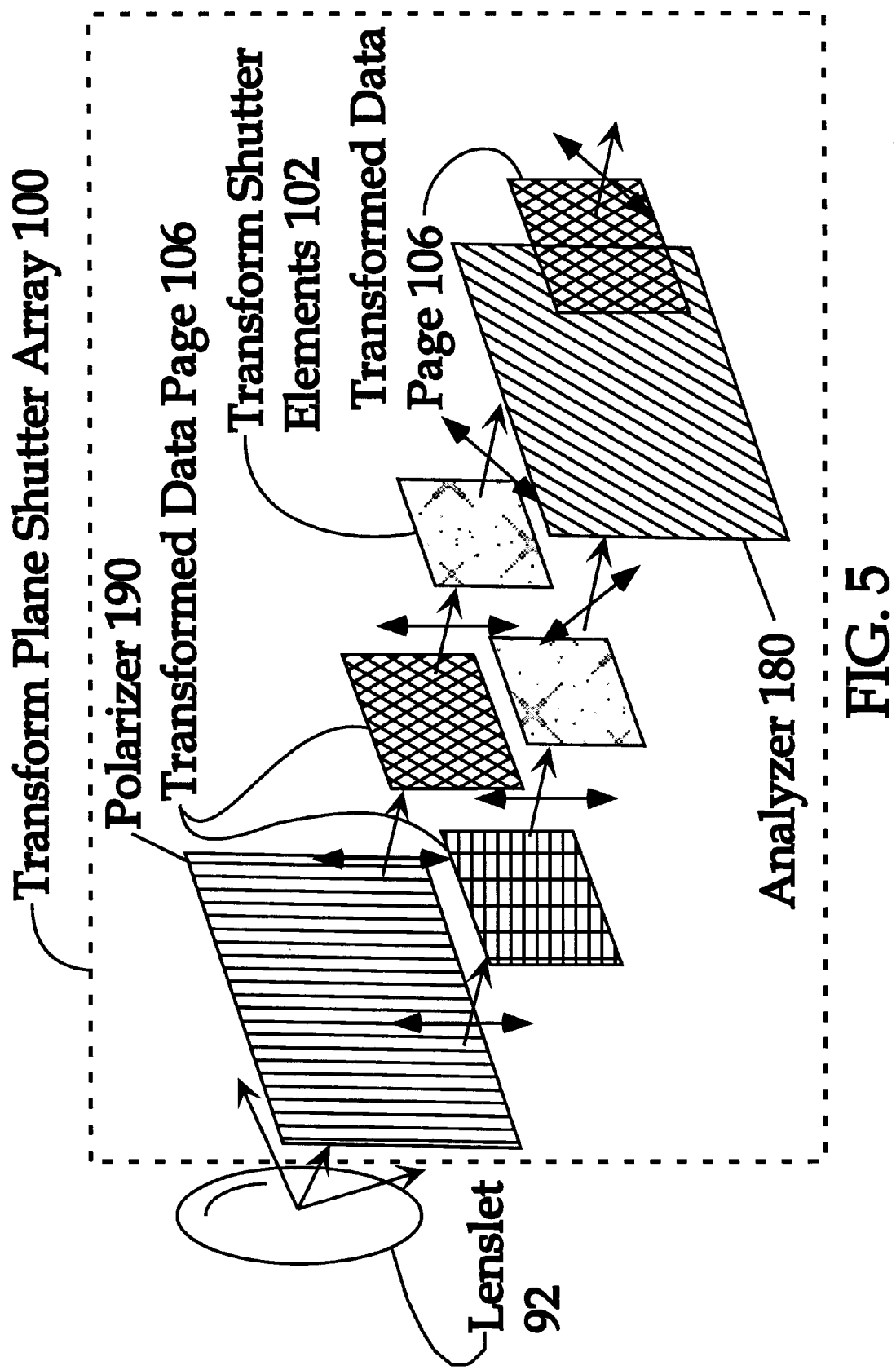
FIG. 5 is an exploded operational plan view of an embodiment of the transform plane shutter array in accordance with an embodiment of the present invention.
Figure 6:
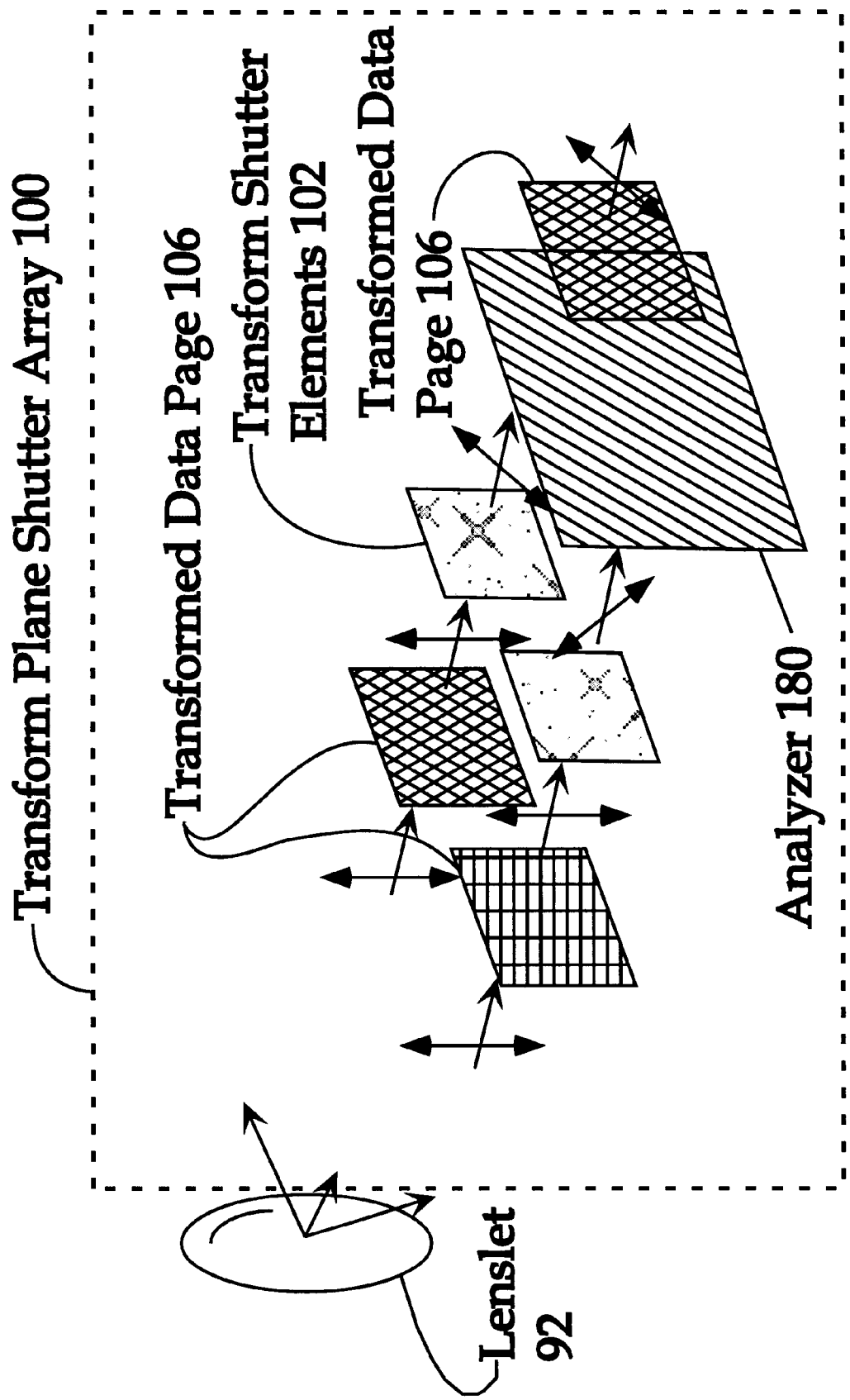
FIG. 6 is an exploded operational plan view of another embodiment of the transform plane shutter array in which the impinging light is already polarized and a separate polarizer is not necessary.

The transform plane shutter array 100, as shown in FIGS. 5 and 6, uses a magneto-optic spatial light modulator (MOSLM) containing transform shutter elements 102. The MOSLM is preferred over a liquid crystal modulator (LCM) because the switching speed is faster and the on/off contrast ratios are higher. Both of the technologies are well known in the optical community. The MOSLM is sandwiched between two sheet polarizers of the dichroic type, a polarizer 190 and analyzer 180. The polarizer 190 can be eliminated, as shown in FIG. 6 if the impinging light is already linearly polarized. The polarization axis of the polarizer 190 is orthogonal to the polarization axis of analyzer 180. When a specific MOSLM transform shutter element 102 is energized, the polarization of the light passing through the element will be rotated 90 degrees, thereby allowing it to pass thorough the analyzer 180 unattenuated. The unenergized transform shutter elements 102 will not rotate the polarization of the light and the analyzer 180 will significantly attenuate the light. Each of the transform shutter elements 102 within the spatial frequency plane shutter array 100 shall be of a size equal to the area of a transformed data page 106. The location of each transform shutter element 102 corresponds to the location of the transformed data page 106 as shown in FIG. 4 for each lenslet. These locations are determined radially and azmuthally using equation 12 to determine radial distance and the angle, $\Theta_{76}$, of the carrier frequency recording as the azmuthal direction. In an alternative embodiment, a plurality of smaller shutter elements could be used in synchronization to cover the area of a transformed data page 106. For this to work properly, a computer would activate all the smaller shutters elements simultaneously so as to allow the light corresponding to a transformed data page 106 to pass. It should noted that the DC component located on the optical axis of the lenslet 92 must be blocked so as to allow the phase information to be converted into an amplitude image of the data page 74 at the photodetector array 140. This technique of changing a phase-only object into an amplitude representation of the phase at the detector is known in the optics community as the dark field technique. This dark field technique is well known in literature along with various other approaches to convert the phase information into an amplitude distribution.

The transform plane shutter array 100 is followed optically by a reimaging lens 120 that has a single common aperture encompassing the entire transform lenslet array 90 and serves to bend the various ray of light associated with the images of different data pages 74 onto the common image read-out plane of the photodetector array 140. The first surface of the reimaging lens, adjacent to the transform plane shutter array 100, is made strongly aspheric. By contouring the first surface of the reimaging lens 120 aspherically, the surface provides a unique optical treatment of the ray bundles near the edges of the lens. This unique optical treatment is needed to accommodate the relatively large field angle due to the close spacing between the transform lenslet array 90 and the reimaging lens 120. The focal length of the reimaging lens 120 is the distance following this lens on which the refocused images of the data pages 74 occurs. The magnification, M, of the lens system including the lenslet 92 and the reimaging lens 120 is determined by the focal lengths of each lens. Specifically, it can be determined by $$M = \frac{f_{120}}{f_{92}}, \qquad \text{Eq. 13}$$

where $f_{120}$ is the focal length of the reimaging lens 120 and $f_{92}$ is the focal length of the lenslet 92. The minus sign simply means that the image of the data page will be inverted relative to the data page 74 stored on the data card 60. The magnification of the lens system is determined by the size of the photodetector array 140 relative to the data page 74 located on the data card 60. For instance, if the detector array was 20 mm by 20 mm square, and the data page 74 was 1 mm by 1 mm square, then the magnification would be 20. A more complete lens design is given by Russell's in the '714 patent, referenced above.

FIG. 1 illustrates a preferred photodetector array 140 using photosensitive elements provided by a conventional charge coupled device (CCD) array formed in a large-scale integrated circuit. These devices are well known in the optics community and the operational details of how sensor works will not be mentioned here. Each of the sensor elements (pixels) is arranged with the photodetector array 140 to correspond to the pattern of phase altering storage pixels 76 within a data page 74. The charge-coupled pixels receive a level of charge proportional to the amount of light illuminating the pixel and store the charge in underlying storage regions of the photodetector array 140. After a preset integration time, the stored data representing an analog version of the data page 74 is shifted out of the buffer registers serially, and converted into digital data, typically binary ones and zeroes using an A/D converter. Adjustable thresholds are built into most A/D converters to determine the levels for the digital information. To increase the speed at which the computer receives the data from the photodetector array 140, it may be preferred to shift the analog data out in parallel registers. Depending on the design of the photodetector array 140 and the buffer registers, the data output capability of the present invention enables unusually large data words to be accessed virtually at the same instant. In other words, the size of the word to be accessed is limited only by the number of pixels in the photodetector array 140 and the addressing electronics controlling the photodetector array 140.

Although various preferred embodiments of the present invention have been described herein in detail to provide for complete and clear disclosure, it will be appreciated by those skilled in the art, that variations may be made thereto without departing from the spirit of the invention or the scope of the appended claims.

What is claimed is:

1. A photorefractive read-only optical memory apparatus using phase, frequency, and angular modulation, comprising:

a controllable quasi-monochromatic light source for producing collimated light;

at least one photorefractive data layer deployed orthogonally to the direction of propagation of the collimated light of said controllable quasi-monochromatic light source and arranged such that the collimated light is transmitted through said photorefractive data layer and further comprising:

at least one page area for storing recorded information and altering the transmitted collimated light, further comprising:

at least one data page containing an array of phase altering storage pixels for encoding the recorded information as a phase delay of the transmitted collimated light, wherein said array of phase altering storage pixels are aligned, with respect to the transmitted collimated light, with all of said arrays of phase altering storage pixels in the same one of said page areas and with all of said arrays of phase altering storage pixels in any of said page areas aligned, with respect to the transmitted collimated light, with the same one of said page areas, and further wherein all of the phase altering storage pixels in any of said array of phase altering storage pixels in any of said data pages are carrier modulated in frequency and angle such that the carrier frequency and angle is unique for each data page amongst all the data pages aligned, with respect to the transmitted collimated light;

a lenslet for each of said alignment of page areas for accepting the transmitted collimated light after passing through said alignment of page areas and transmitting transformed images of each one of said data pages, in accordance with the unique carrier frequency and angle modulation of said contained array of phase altering storage pixels, onto a spatial frequency plane;

a transform plane shutter array, deployed in the spatial frequency plane, comprising a plurality of shutter elements for selectively passing the transmitted transformed image of only one of said data pages and not transmitting the unmodulated carrier transform;

a reimaging lens for accepting the passed transmitted transformed image of only one of said data pages and imaging the passed transmitted transformed image of only one of said data pages onto an image plane;

a photodetector array deployed in the image plane to receive the transmitted transformed image of only one of said data pages and reproduce the recorded data;

means for controlling said transform plane shutter array to selectively chose one of said data pages; and means for accepting the reproduced data from said photodetector array.

2. The photorefractive read-only optical memory apparatus using phase, frequency, and angular modulation of claim 1, wherein the encoding of the recorded information in said array of phase altering storage pixel is binary.

3. The photorefractive read-only optical memory apparatus using phase, frequency, and angular modulation of claim 1, wherein the encoding of the recorded information in said array of phase altering storage pixel is recorded at a plurality of levels of phase delay.

4. The photorefractive read-only optical memory apparatus using phase, frequency, and angular modulation of claim 1, wherein said controllable quasi-monochromatic light source can selectively transmit collimated light through only one of said alignment of page areas and further comprising means to control said controllable quasi-monochromatic light source to selectively chose one of said alignment of page areas for light transmission.

5. The photorefractive read-only optical memory apparatus using phase, frequency, and angular modulation of claim 1, wherein said controllable quasi-monochromatic light source can transmit collimated light at a plurality of selected wavelengths.

6. The photorefractive read-only optical memory apparatus using phase, frequency, and angular modulation of claim 1, wherein said photorefractive data layers and said lenslets are bonded together forming a removable and replaceable read-only data media.

* * * * *